United States Patent
Hirai et al.

(10) Patent No.: US 9,045,667 B2
(45) Date of Patent: Jun. 2, 2015

(54) CURABLE SILICONE COMPOSITION, CURED PRODUCT THEREOF, AND OPTICAL SEMICONDUCTOR DEVICE

(75) Inventors: Kazuo Hirai, Sodegaura (JP); Makoto Yoshitake, Ichihara (JP)

(73) Assignee: DOW CORNING TORAY CO., LTD., Chyoda-Ku, Tokyo (JP)

(*) Notice: Subject to any disclaimer, the term of this patent is extended or adjusted under 35 U.S.C. 154(b) by 0 days.

(21) Appl. No.: 14/344,919

(22) PCT Filed: Sep. 13, 2012

(86) PCT No.: PCT/JP2012/074138
§ 371 (c)(1),
(2), (4) Date: Aug. 25, 2014

(87) PCT Pub. No.: WO2013/039265
PCT Pub. Date: Mar. 21, 2013

(65) Prior Publication Data
US 2014/0377570 A1    Dec. 25, 2014

(30) Foreign Application Priority Data

Sep. 16, 2011 (JP) ................... 2011-203542
Feb. 2, 2012 (JP) ................... 2012-021278

(51) Int. Cl.
*H01L 33/00* (2010.01)
*H01L 33/60* (2010.01)
(Continued)

(52) U.S. Cl.
CPC ............ *C09D 183/04* (2013.01); *C08G 77/20* (2013.01); *C08L 83/04* (2013.01); *H01L 33/60* (2013.01); *H01L 2224/32245* (2013.01);
(Continued)

(58) Field of Classification Search
None
See application file for complete search history.

(56) References Cited

U.S. PATENT DOCUMENTS 5,438,094 A * 8/1995 Fujiki et al. ............. 524/730
6,624,231 B2 * 9/2003 Shiono ..................... 524/492
(Continued)

FOREIGN PATENT DOCUMENTS

JP    2009021394 A    1/2009
JP    2011140550 A    7/2011

OTHER PUBLICATIONS

English language abstract and machine-assisted English translation for JP 2009021394 extracted from espacenet.com database on Jun. 30, 2014, 10 pages.
(Continued)

*Primary Examiner* — Robert S Loewe
(74) *Attorney, Agent, or Firm* — Howard & Howard Attorneys PLLC (57) ABSTRACT

A curable silicone composition which comprises: (A) an organopolysiloxane represented by an average unit formula; (B) an organopolysiloxane that has not more than 10 silicon atoms wherein from 30 to 60 mole % of all silicon-bonded organic groups therein are $C_{2-6}$191 alkenyl groups; (C) an organopolysiloxane represented by a general formula; (D) an organopolysiloxane that has at least two silicon-bonded hydrogen atoms in one molecule wherein from 20 to 70 mole % of all silicon-bonded organic groups therein are phenyl groups; (E) a hydrosilylation reaction catalyst; (F) a white pigment; (G) a nonspherical silica or a glass fiber; and (H) a spherical silica, exhibits an excellent moldability and forms a cured product that exhibits little heat- and/or light-induced discoloration, little heat- and/or light-induced decline in mechanical strength, a high light reflectance, and an excellent dimensional stability.

12 Claims, 1 Drawing Sheet

(51) Int. Cl.
*C08K 5/549* (2006.01)
*C09D 183/04* (2006.01)
*C08G 77/20* (2006.01)
*C08L 83/04* (2006.01)
*H01L 27/146* (2006.01)
*H01L 31/0216* (2014.01)

(52) U.S. Cl.
CPC ............. *H01L 2224/48091* (2013.01); *H01L 2224/48247* (2013.01); *H01L 2224/73265* (2013.01); *H01L 27/14629* (2013.01); *H01L 31/02161* (2013.01)

(56) References Cited

U.S. PATENT DOCUMENTS

| | | | |
|---|---|---|---|
| 2005/0209400 A1* | 9/2005 | Tsumura et al. | 525/100 |
| 2005/0256259 A1* | 11/2005 | Goto et al. | 524/588 |
| 2007/0219312 A1* | 9/2007 | David | 524/588 |
| 2008/0057325 A1* | 3/2008 | Sakurai et al. | 428/447 |
| 2008/0220266 A1* | 9/2008 | Murai et al. | 428/447 |
| 2008/0254247 A1* | 10/2008 | Asaine | 428/40.9 |
| 2009/0121180 A1* | 5/2009 | Tsubokawa et al. | 252/182.3 |
| 2009/0123764 A1* | 5/2009 | Morita et al. | 428/446 |
| 2009/0258216 A1* | 10/2009 | Yamakawa et al. | 428/323 |
| 2011/0024675 A1* | 2/2011 | Endo et al. | 252/78.3 |
| 2011/0058776 A1 | 3/2011 | Taniguchi et al. | |
| 2011/0188213 A1* | 8/2011 | Domae et al. | 361/748 |

OTHER PUBLICATIONS

English language abstract and machine-assisted English translation for JP 2011-140550 extracted from PAJ database on Jun. 30, 2014, 24 pages.

International Search Report for PCT/JP2012/074138 dated Jan. 31, 2013, 3 pages.

* cited by examiner

CURABLE SILICONE COMPOSITION, CURED PRODUCT THEREOF, AND OPTICAL SEMICONDUCTOR DEVICE

TECHNICAL FIELD

The present invention relates to a curable silicone composition, a cured product thereof, and an optical semiconductor device that uses this cured product as a light-reflecting material.

This application is the National Stage of International Patent Application No. PCT/JP2012/074138, filed on Sep. 13, 2012, which claims priority to Japanese Patent Application Nos. 2011-203542 and 2012-021278, filed on Sep. 16, 2011 and Feb. 2, 2012, respectively, the contents of which are incorporated herein by reference.

BACKGROUND ART

Curable silicone compositions that cure by a hydrosilylation reaction are used as, for example, protective agents, coating agents, lens molding materials, and light-reflecting materials for optical semiconductor devices, for example, photocouplers, light-emitting diodes, and solid-state imaging devices. Among these, the compositions used as light-reflecting materials can be exemplified by a resin composition for a mounting package that incorporates an optical semiconductor element, wherein this resin composition comprises a white pigment, a platinum-type catalyst as a curing catalyst, and a thermosetting addition-reacting silicone resin that has a structure in which vinyl groups or allyl groups, and hydrogen atoms are directly bonded to silicons (refer to Japanese Unexamined Patent Application Publication (hereinafter referred to as "Kokai") 2009-21394; and by an addition-curing silicone resin composition that has an average visible light reflectance post-cure of at least 80% and that comprises a vinyl-functional organopolysiloxane having a weight-average molecular weight (Mw) of at least 30,000, an organohydrogenpolysiloxane having at least two silicon-bonded hydrogen atoms in one molecule, a white pigment, an inorganic filler other than the white pigment, a platinum metal-type catalyst, and a reaction inhibitor (refer to Kokai 2011-140550).

These compositions exhibit the following problems during transfer molding, injection molding, or compression molding: a low mold-filling performance, facile generation of voids and flashing, and/or a poor mold releasability; also, a slow curing rate and a poor workability in the molding operation. In addition, the cured products provided by the cure of these compositions, while offering the advantage of little heat- and/or light-induced discoloration, suffer from the problems of a large linear thermal expansion coefficient and/or a low mechanical strength at elevated temperatures, as well as the problems of an inadequate light reflectance and a large heat- and/or light-induced decline in mechanical strength.

It is an object of the present invention to provide a curable silicone composition that exhibits an excellent moldability and that forms a cured product that exhibits little heat- and/or light-induced discoloration, little heat- and/or light-induced decline in mechanical strength, a high light reflectance, and an excellent dimensional stability.

It is another object of the present invention to provide a cured product that exhibits little heat- and/or light-induced discoloration, little heat- and/or light-induced decline in mechanical strength, and a high light reflectance.

It is further another object of the present invention is to provide an optical semiconductor device that uses this cured product as a light-reflecting material.

DISCLOSURE OF INVENTION

The curable silicone composition of the present invention characteristically comprises:

(A) 100 parts by mass of an organopolysiloxane represented by the following average unit formula:

$(R^1{}_3SiO_{1/2})_a(R^1{}_2SiO_{2/2})_b(R^1SiO_{3/2})_c(SiO_{4/2})_d(R^2O_{1/2})_e$ wherein each $R^1$ is independently a phenyl group, a $C_{1-6}$ alkyl group, or a $C_{2-6}$ alkenyl group; however, from 30 to 80 mole % of all groups designated by $R^1$ are phenyl groups and from 5 to 20 mole % of all groups designated by $R^1$ are alkenyl groups; $R^2$ is a hydrogen atom or a $C_{1-6}$ alkyl group; and "a", "b", "c", "d", and "e" are numbers that respectively satisfy: $0 \leq a \leq 0.3$, $0 \leq b \leq 0.7$, $0.3 \leq c \leq 0.9$, $0 \leq d \leq 0.1$, $0 \leq e \leq 0.1$, and $a+b+c+d=1$;

(B) 5 to 50 parts by mass of an organopolysiloxane that has not more than 10 silicon atoms wherein from 30 to 60 mole % of all silicon-bonded organic groups are $C_{2-6}$ alkenyl groups;

(C) 0 to 40 parts by mass of an organopolysiloxane represented by the following general formula:

$R^3{}_3SiO(R^3{}_2SiO)_mSiR^3{}_3$ wherein each $R^3$ independently represents a phenyl group, a $C_{1-6}$ alkyl group, or a $C_{2-6}$ alkenyl group; however, from 30 to 70 mole % of all groups designated by $R^3$ are phenyl groups and at least one of all groups designated by $R^3$ is an alkenyl group; and "m" is an integer from 10 to 100;

(D) an organopolysiloxane that has at least two silicon-bonded hydrogen atoms in one molecule wherein from 20 to 70 mole % of all silicon-bonded organic groups are phenyl groups, in an amount that provides from 0.5 to 2 moles of silicon-bonded hydrogen atoms in this component per 1 mole of the total amount of the alkenyl groups in components (A), (B), and (C);

(E) a hydrosilylation reaction catalyst in a quantity sufficient to accelerate the hydrosilylation reaction between the alkenyl groups in components (A), (B), and (C) and the silicon-bonded hydrogen atoms in component (D);

(F) a white pigment in an amount of at least 25 parts by mass per 100 parts by mass of the total amount of components (A), (B), (C), (D), and (E);

(G) a nonspherical silica or a glass fiber in an amount of at least 20 parts by mass per 100 parts by mass of the total amount of components (A), (B), (C), (D), and (E); and (H) a spherical silica in an amount of at least 20 parts by mass per 100 parts by mass of the total amount of components (A), (B), (C), (D), and (E), wherein the content of the total amount of components (F), (G), and (H) is not more than 300 parts by mass per 100 parts by mass of the total amount of components (A), (B), (C), (D), and (E).

The cured product of the present invention is characteristically provided by curing the curable silicone composition described above.

The optical semiconductor device of the present invention is characterized in that a light-reflecting material therein is formed by the cured product indicated above.

EFFECTS OF INVENTION

The curable silicone composition of the present invention is characterized by an excellent moldability and upon curing characteristically forms a cured product that exhibits little heat- and/or light-induced decline in mechanical strength, little heat- and/or light-induced discoloration, a high light reflectance, and an excellent dimensional stability. In addition, the cured product of the present invention characteristically exhibits little heat- and/or light-induced decline in mechanical strength, little heat- and/or light-induced discoloration, and a high light reflectance. Furthermore, the optical semiconductor device of the present invention characteristically exhibits little thermal deterioration or photodegradation of its light-reflecting material.

DETAILED DESCRIPTION OF THE INVENTION

The curable silicone composition of the present invention will be described in detail first.

Component (A) is the base component of the present composition and is an organopolysiloxane represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

Each $R^1$ in the formula is independently a phenyl group, a $C_{1-6}$ alkyl group, or a $C_{2-6}$ alkenyl group. The alkyl groups designated by $R^1$ can be exemplified by methyl, ethyl, propyl, butyl, pentyl, hexyl, cyclopentyl, and cyclohexyl. The alkenyl groups designated by $R^1$ can be exemplified by vinyl, allyl, butenyl, pentenyl, and hexenyl. The phenyl group content in all groups designated by $R^1$ in the formula is in the range from 30 to 80 mole % and is preferably in the range from 40 to 70 mole %. The reasons for this are as follows: the resulting cured product has an excellent mechanical strength when the phenyl group content is at least as large as the lower limit on the aforementioned range, while the resulting cured product has an excellent hardness at elevated temperatures when the phenyl group content does not exceed the upper limit on the aforementioned range. In addition, the alkenyl group content in all groups designated by $R^1$ in the formula is in the range from 5 to 20 mole %. The reasons for this are as follows: the resulting cured product has an excellent hardness at room temperature when the alkenyl group content is at least as large as the lower limit on the aforementioned range, while the resulting cured product exhibits an excellent mechanical strength when the alkenyl group content does not exceed the upper limit on the aforementioned range.

$R^2$ in the formula is a hydrogen atom or a $C_{1-6}$ alkyl group. The alkyl groups designated by $R^2$ can be exemplified by methyl, ethyl, propyl, butyl, pentyl, and hexyl.

In addition, "a" in the formula is a number that represents the proportion of the siloxane units with the general formula: $R^1{}_3SiO_{1/2}$ and is a number that satisfies 0≤a≤0.3 and preferably 0≤a≤0.25. The reason for this is as follows: the resulting cured product has an excellent hardness at room temperature when "a" is less than or equal to the upper limit on the indicated range. "b" in the formula is a number that represents the proportion of the siloxane units with the general formula: $R^1{}_2SiO_{2/2}$ and is a number that satisfies 0≤b≤0.7 and preferably 0≤b≤0.6. The reason for this is as follows: the resulting cured product has an excellent hardness at room temperature when "b" is less than or equal to the upper limit on the indicated range. "c" is a number that represents the proportion of the siloxane units with the general formula: $R^1SiO_{3/2}$ and is a number that satisfies 0.3≤c≤0.9 and preferably 0.35≤c≤0.85. The reasons for this are as follows: the resulting cured product has an excellent hardness at room temperature when "c" is at least as large as the lower limit on the indicated range, while the resulting cured product has an excellent mechanical strength when "c" is less than or equal to the upper limit on the indicated range. "d" is a number that represents the proportion of the siloxane units with the general formula: $SiO_{4/2}$ and is a number that satisfies 0≤d≤0.1. The reason for this is as follows: the resulting cured product has an excellent mechanical strength when "d" is less than or equal to the upper limit on the indicated range. "e" is a number that represents the proportion of units with the general formula: $R^2O_{1/2}$ and is a number that satisfies 0≤e≤0.1. The reason for this is as follows: the resulting cured product has an excellent hardness at room temperature when "e" is less than or equal to the upper limit on the indicated range. The sum of "a", "b", "c", and "d" in the formula is 1.

Component (B) is a component that improves the handling characteristics of the present composition and that adjusts the hardness of the resulting cured product and is an organopolysiloxane that has not more than 10 silicon atoms wherein from 30 to 60 mole % of all silicon-bonded organic groups are $C_{2-6}$ alkenyl groups. The alkenyl group in component (B) can be exemplified by vinyl, allyl, butenyl, pentenyl, and hexenyl. The silicon-bonded organic groups other than alkenyl groups in component (B) are not particularly limited and can be exemplified by methyl and phenyl wherein methyl is preferred. From 30 to 60 mole % of all silicon-bonded organic groups are $C_{2-6}$ alkenyl groups. The reasons for this are as follows: the resulting cured product has an excellent hardness when the alkenyl group content is at least as large as the lower limit on the indicated range, while the resulting cured product has an excellent mechanical strength when the alkenyl group content is less than or equal to the upper limit on the indicated range. The number of silicon atoms is not more 10, and the reason for this is that the composition exhibits an excellent viscosity when the number of silicon atoms does not exceed 10.

This component (B) can be exemplified by 1,3,5,7-tetramethyl-1,3,5,7-tetravinylcyclotetrasiloxane, tetrakis(dimethylvinylsiloxy)silane, methyltris(dimethylvinylsiloxy)silane, and phenyltris(dimethylvinylsiloxy)silane.

The component (B) content in the present composition is a quantity, expressed per 100 parts by mass of component (A), within the range from 5 to 50 parts by mass and preferably is a quantity within the range from 5 to 40 parts by mass. The reasons for this are as follows: the composition exhibits an excellent viscosity when the component (B) content is at least as large as the lower limit for the indicated range, while the resulting cured product exhibits an excellent mechanical strength when the component (B) content is less than or equal to the upper limit for the indicated range.

Component (C) is an optional component for adjusting the viscosity of the present composition and adjusting the hardness and mechanical strength of the resulting cured product, and is an organopolysiloxane represented by the following general formula:

$$R^3{}_3SiO(R^3{}_2SiO)_mSiR^3{}_3$$

Each $R^3$ in the formula is independently the phenyl group, a $C_{1-6}$ alkyl group, or a $C_{2-6}$ alkenyl group. The alkyl groups designated by $R^3$ can be exemplified by methyl, ethyl, propyl, butyl, pentyl, hexyl, cyclopentyl, and cyclohexyl. The alkenyl groups designated by $R^3$ can be exemplified by vinyl, allyl, butenyl, pentenyl, and hexenyl. The phenyl group content in all groups designated by $R^3$ in the formula is in the range from 30 to 70 mole % and preferably in the range from 40 to 60 mole %. The reasons for this are as follows: the resulting cured product has an excellent mechanical strength when the phenyl group content is at least as large as the lower limit on the indicated range, while the resulting cured product exhibits an excellent hardness when the phenyl group content is less than or equal to the upper limit for the indicated range. Moreover, at least one of all groups designated by $R^3$ in the formula is an alkenyl group because the presence of an alkenyl group enables this component to be incorporated by the curing reaction.

"m" in the formula is an integer in the range from 10 to 100 and is preferably an integer in the range from 10 to 50. The reasons for this are as follows: the resulting cured product exhibits an excellent mechanical strength when "m" is at least as large as the lower limit for the indicated range, while the resulting composition exhibits excellent handling characteristics when "m" is less than or equal to the upper limit for the indicated range.

The component (C) content in the present composition is an amount, expressed per 100 parts by mass of component (A), within the range from 0 to 40 parts by mass and preferably within the range from 0 to 20 parts by mass. The reason for this is as follows: the resulting cured product exhibits an excellent hardness when the component (C) content is less than or equal to the upper limit for the indicated range.

Component (D) is a crosslinking agent for the present composition and is an organopolysiloxane that has at least two silicon-bonded hydrogen atoms in one molecule wherein from 20 to 70 mole % of all silicon-bonded organic groups are phenyl groups. Component (D) contains at least two silicon-bonded hydrogen atoms in one molecule because this provides a satisfactory curing-induced crosslinking and yields a cured product with an excellent hardness. Silicon-bonded organic groups in component (D) can be exemplified by monovalent hydrocarbon groups that do not have an aliphatically unsaturated bond, e.g., alkyl groups such as methyl, ethyl, propyl, butyl, pentyl, hexyl, heptyl, cyclopentyl, cyclohexyl, and cycloheptyl; aryl groups such as phenyl, tolyl, and xylyl; and aralkyl groups such as benzyl and phenethyl, wherein phenyl and $C_{1-6}$ alkyl are preferred. From 20 to 70 mole % of all silicon-bonded organic groups in component (D) are phenyl groups. The reasons for this are as follows: the resulting cured product has an excellent mechanical strength at elevated temperature when the phenyl group content is at least as large as the lower limit on the indicated range, while the resulting cured product has an excellent mechanical strength when the phenyl group content is less than or equal to the upper limit on the indicated range.

Component (D) can be exemplified by an organotrisiloxane having the following general formula:

$$(HR^4{}_2SiO)_2SiR^4{}_2;$$

a straight-chain organopolysiloxane having the following general formula:

$$R^5{}_3SiO(R^5{}_2SiO)_nSiR^5{}_3;$$

and a branched-chain organopolysiloxane having the following average unit formula:

$$(R^5SiO_{3/2})_p(R^5{}_2SiO_{2/2})_q(R^5{}_3SiO_{1/2})_r(SiO_{4/2})_s(XO_{1/2})_t$$

Each $R^4$ in the formula is independently a phenyl group or a $C_{1-6}$ alkyl group. The alkyl groups designated by $R^4$ can be exemplified by methyl, ethyl, propyl, butyl, pentyl, hexyl, cyclopentyl, and cyclohexyl. In addition, phenyl group content in all groups designated by $R^4$ is within the range from 30 to 70 mole %.

Each $R^5$ in the formula is independently a hydrogen atom, a phenyl group, or a $C_{1-6}$ alkyl group, and at least two of all groups designated by $R^5$ in the formula are hydrogen atoms. The alkyl groups designated by $R^5$ can be exemplified by methyl, ethyl, propyl, butyl, pentyl, hexyl, cyclopentyl, and cyclohexyl. The phenyl group content in all groups designated by $R^5$, excluding the hydrogen atoms, is in the range from 30 to 70 mole %.

"n" in the formula is an integer in the range from 5 to 1,000. "p" in the formula is a positive number; "q" is 0 or a positive number; "r" is 0 or a positive number; "s" is 0 or a positive number; "t" is 0 or a positive number; "q/p" is a number in the range from 0 to 10; "r/p" is a number in the range from 0 to 5; "s/(p+q+r+s)" is a number in the range from 0 to 0.3; and "t/(p+q+r+s)" is a number in the range from 0 to 0.4.

All or the major portion of this component (D) is preferably the organotrisiloxane having the following general formula:

$$(HR^4{}_2SiO)_2SiR^4{}_2$$

and this organotrisiloxane is preferably at least 50 mass % of component (D).

The component (D) content in the present composition is a quantity that provides, expressed per 1 mole of the total amount of the alkenyl groups in components (A), (B), and (C), from 0.5 to 2 moles silicon-bonded hydrogen atoms in this component and preferably from 0.5 to 1.5 moles. The reason for this is as follows: the resulting cured product exhibits an excellent hardness when the component (D) content is in the indicated range.

Component (E) is a hydrosilylation reaction catalyst for accelerating the hydrosilylation reaction between the alkenyl groups in components (A), (B), and (C) and the silicon-bonded hydrogen atoms in component (D). Component (E) can be exemplified by platinum catalysts, rhodium catalysts, and palladium catalysts, and platinum catalysts are preferred because they can substantially accelerate the cure of the present composition. These platinum catalysts can be exemplified by finely divided platinum powder, chloroplatinic acid, alcohol solutions of chloroplatinic acid, platinum-alkenylsiloxane complexes, platinum-olefin complexes, and platinum-carbonyl complexes, with platinum-alkenylsiloxane complexes being particularly preferred. The alkenylsiloxane can be exemplified by 1,3-divinyl-1,1,3,3-tetramethyldisiloxane, 1,3,5,7-tetramethyl-1,3,5,7-tetravinylcyclotetrasiloxane, alkenylsiloxanes provided by replacing a portion of the methyl in the preceding alkenylsiloxanes with, for example, ethyl or phenyl, and alkenylsiloxanes provided by replacing the vinyl group in the preceding alkenylsiloxanes with, for example, the allyl group or hexenyl group. 1,3-divinyl-1,1,3,3-tetramethyldisiloxane is particularly preferred because the corresponding platinum-alkenylsiloxane complex has an excellent stability. Moreover, the stability of this platinum-alkenylsiloxane complex can be enhanced by the addition to the complex of an alkenylsiloxane such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, and so forth, or an organosiloxane oligomer such as a dimethylsiloxane oligomer and so forth, and this addition is therefore preferred; the addition of an alkenylsiloxane is particularly preferred.

The component (E) content in the present composition is a quantity sufficient to accelerate the hydrosilylation reaction between the alkenyl groups in components (A), (B), and (C) and the silicon-bonded hydrogen atoms in component (D), but is not otherwise particularly limited. The component (E)

content in the present composition, expressed with reference to the present composition, is preferably a quantity that provides from 0.01 to 500 mass-ppm of the metal atom in this component, more preferably a quantity that provides from 0.01 to 100 mass-ppm of the metal atom in this component, and particularly preferably a quantity that provides from 0.01 to 50 mass-ppm of the metal atom in this component. The reasons for this are as follows: the resulting composition exhibits an excellent cure when the component (E) content is at least as large as the lower limit on the indicated range, while the generation of color in the resulting cured product is inhibited when the component (E) content is less than or equal to the upper limit on the indicated range.

Component (F) is a white pigment for imparting white color to the composition and cured product of the present invention and thereby raising the light reflectance. Component (F) can be exemplified by metal oxides such as titanium oxide, alumina, zinc oxide, zirconium oxide, and magnesium oxide, and by barium sulfate and zinc sulfate, wherein titanium oxide and zinc oxide are particularly preferred.

While there are no limitations on the average particle size or the shape of component (F), the average particle size is preferably in the range from 0.05 to 10.0 μm and more preferably in the range from 0.1 to 5.0 μm. A white pigment can be used that has been subjected to a surface treatment with, for example, a silane coupling agent, silica, or alumina, in order to increase the compatibility with the resin or inorganic filler and the dispersibility.

The component (F) content in the present composition, expressed per 100 parts by mass of the total amount of components (A), (B), (C), (D), and (E), is at least 25 parts by mass and preferably is at least 30 parts by mass. The reason for this is as follows: the resulting cured product exhibits an excellent light reflectance when the component (F) content is at least as large as the aforementioned lower limit.

Component (G) is a nonspherical silica or a glass fiber and is added in order to minimize the linear thermal expansion coefficient of the cured product of the present invention and thus improve the dimensional stability. The nonspherical silica encompassed by component (G) can be exemplified by quartz powder and glass beads, wherein quartz powder is preferred. The glass fiber can be exemplified by chopped glass fiber and milled glass fiber wherein milled glass fiber is preferred.

While there are no limitations on the average particle size of the nonspherical silica encompassed by component (G), it is preferably in the range from 0.1 to 20 μm and more preferably in the range from 0.5 to 10 μm. While there are no limitations on the shape of the glass fiber encompassed by component (G), the fiber diameter is preferably in the range from 1 to 50 μm and more preferably is in the range from 5 to 20 μm and the fiber length is preferably in the range from 5 to 500 μm and more preferably is in the range from 10 to 300 μm.

The component (G) content in the present composition, expressed per 100 parts by mass of the total of components (A), (B), (C), (D), and (E), is at least 20 parts by mass and preferably at least 25 parts by mass. The reason for this is as follows: the resulting cured product has a low linear thermal expansion coefficient and an excellent dimensional stability when the component (G) content is at least as large as the aforementioned lower limit.

Component (H) is a spherical silica, which has the purpose of ameliorating the reduction in processability brought about by an increased viscosity for the composition of the present invention. Component (H) can be exemplified by dry-method silica, wet-method silica, fused silica, and deflagration method silica, wherein fused silica is preferred because it exhibits an excellent capacity for filling into the present composition.

While there are no limitations on the particle size of component (H), the average particle size is preferably in the range from 0.1 to 50 μm and more preferably is in the range from 0.5 to 20 μm.

The component (H) content in the present composition, expressed per 100 parts by mass of the total amount of components (A), (B), (C), (D), and (E), is at least 20 parts by mass and preferably is at least 30 parts by mass. The reason for this is that the resulting composition exhibits an excellent viscosity when the component (H) content is at least as large as the indicated lower limit.

The content of the total amount of components (F), (G), and (H) in the present composition, expressed per 100 parts by mass of the total amount of components (A), (B), (C), (D), and (E), is not more than 300 parts by mass and preferably is not more than 250 parts by mass. The resulting composition has an excellent viscosity when the content of the total amount of components (F), (G), and (H) does not exceed the indicated upper limit.

The present composition comprises the components (A) through (H) that have been described in the preceding, but may contain a reaction inhibitor as an additional optional component, for example, an alkyne alcohol such as 1-ethynyl-1-cyclohexanol, 2-methyl-3-butyn-2-ol, 3,5-dimethyl-1-hexyn-3-ol, and 2-phenyl-3-butyn-2-ol; an ene-yne compound such as 3-methyl-3-penten-1-yne and 3,5-dimethyl-3-hexen-1-yne; as well as 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. While there are no limitations on the content of this reaction inhibitor, its content is preferably in the range from 1 to 5,000 mass-ppm with reference to the present composition.

The present composition preferably also contains an adhesion promoter in order to bring about additional improvement in the adhesiveness to the substrate with which the composition is in contact during the cure of the composition. This adhesion promoter can be exemplified by organosilanes or organosiloxane oligomers that have from about 4 to 20 silicon atoms and a straight-chain structure, branched structure, or cyclic structure in either case that contain a trialkoxysiloxy group (for example, a trimethoxysiloxy group or a triethoxysiloxy group) or a trialkoxysilylalkyl group (for example, a trimethoxysilylethyl group or a triethoxysilylethyl group) and a hydrosilyl group or an alkenyl group (for example, a vinyl group or an allyl group); organosilanes or organosiloxane oligomers that have from about 4 to 20 silicon atoms and a straight-chain structure, branched structure, or cyclic structure in either case that contain a trialkoxysiloxy group or trialkoxysilylalkyl group and a methacryloxyalkyl group (for example, a 3-methacryloxypropyl group); organosilanes or organosiloxane oligomers that have from about 4 to 20 silicon atoms and a straight-chain structure, branched structure, or cyclic structure in either case that contain a trialkoxysiloxy group or a trialkoxysilylalkyl group and an epoxy-functional alkyl group (for example, the 3-glycidoxypropyl group, 4-glycidoxybutyl group, 2-(3,4-epoxycyclohexyl)ethyl group, 3-(3,4-epoxycyclohexyl)propyl group); the reaction products of an aminoalkyltrialkoxysilane and an epoxy-functional alkyltrialkoxysilane; and epoxy-functional ethyl polysilicates. The adhesion promoter can be specifically exemplified by vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, the reaction product of 3-glycidoxypropyltriethoxysilane and 3-aminopropyltriethoxysilane, the condensation reaction product of a silanol group-endblocked methylvinylsiloxane oligomer and 3-glycidoxypropyltrimethoxysilane, the condensation reaction product of a silanol group-endblocked methylvinylsiloxane oligomer and 3-methacryloxypropyltriethoxysilane, and tris(3-trimethoxysilylpropyl) isocyanurate.

Insofar as the objects of the present invention are not impaired, the present composition may also contain the following, for example, as additional optional components: an inorganic filler other than the nonspherical silica, glass fiber, and spherical silica; a finely divided powder of an organic resin such as a polymethacrylate resin, silicone resin, and so forth; a release agent such as carnauba wax, a metal stearate, or a methylsilicone oil; a heat stabilizer; a flame retardant; a solvent; and so forth.

While the viscosity of the present composition at 25° C. is not particularly limited, it is preferably in the range from 5 to 200 Pa·s, more preferably in the range from 5 to 120 Pa·s, and particularly preferably in the range from 10 to 80 Pa·s. The reasons for this are as follows: the production of flashing during the resulting molding operation is inhibited when the viscosity is at least as large as the lower limit on the indicated range, while the resulting composition exhibits excellent handling properties when the viscosity is less than or equal to the upper limit on the indicated range.

While there are no particular limitations on the hardness of the cured product from the present composition, the type D durometer hardness specified in JIS K 7215-1986, "Testing methods for durometer hardness of plastics", is preferably at least 60, more preferably is at least 65, and particularly preferably is at least 70. The reason for this is as follows: the dimensional stability of the cured product is improved and the occurrence of deformation of the cured product is inhibited when the hardness is at least as large as the indicated lower limit. In addition, while there are no particular limitations on the bending strength of the cured product from the present composition, the bending strength specified in JIS K 6911-1995, "Testing methods for thermosetting plastics", is preferably at least 5 MPa, more preferably at least 7 MPa, and particularly preferably at least 10 MPa. The reason for this is as follows: the cured product has an excellent mechanical strength and the occurrence of, for example, cracking, is inhibited when the flexural strength is at least as large as the lower limit indicated above.

While there are no particular limitations on the reflectance of the cured product from the present composition, the total luminous reflectance as measured by the method specified in JIS K 7375:2008, "Plastics—Determination of total luminous transmittance and reflectance", is preferably at least 80% and particularly preferably is at least 90%. While there are also no particular limitations on the linear thermal expansion coefficient of the cured product from the present composition, the linear thermal expansion coefficient as measured by the method specified in JIS K 7197-1991, "Testing method for linear thermal expansion coefficient of plastics by thermomechanical analysis", is preferably not more than 200 ppm/° C. expressed as the average value in the temperature range from 25 to 200° C. and particularly preferably is not more than 150 ppm/° C. as the average value in the temperature range from 25 to 200° C.

The curing reaction of the present composition will proceed at either room temperature or with the application of heat, but heating is preferably carried out in order to bring about a rapid cure. This heating temperature is preferably in the range from 50 to 200° C. and more preferably is in the range from 100 to 150° C. The method for molding the present composition can be exemplified by transfer molding, injection molding, and compression molding.

The cured product of the present invention will now be specifically described.

The cured product of the present invention is provided by curing the composition described hereinabove. The cured product of the present invention preferably has the properties described hereinabove.

The optical semiconductor device of the present invention will now be described in detail.

The optical semiconductor device of the present invention is characterized in that a light-reflecting material therein is formed by a cured product yielded by the cure of the hereinabove-described composition. Such an optical semiconductor device can be exemplified by light-emitting diodes (LEDs). The light-reflecting material in this optical semiconductor device may also function as a frame material (packaging material) for the optical semiconductor device.

Figure 1:
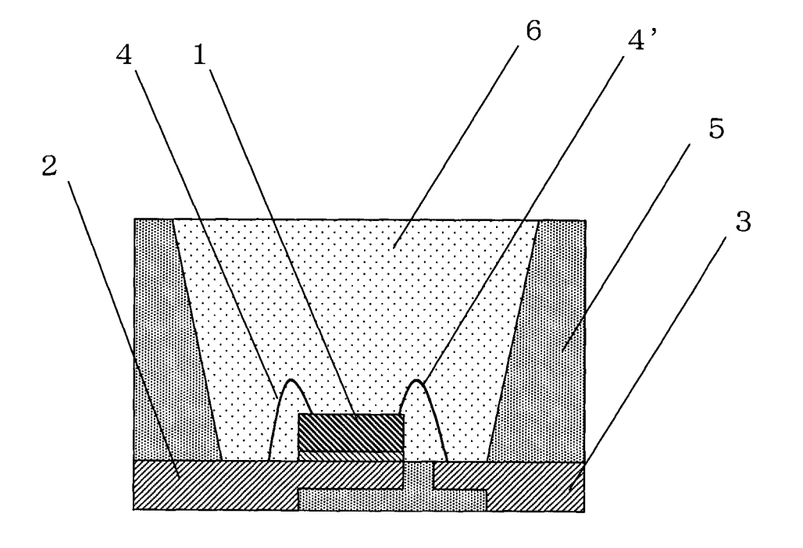
FIG. 1 is a cross-sectional view of an LED that is an example of an optical semiconductor device of the present invention.

FIG. 1 gives a cross-sectional view of a surface-mount LED that is an example of the present optical semiconductor device. In the LED shown in FIG. 1, an optical semiconductor element 1 is die-bonded by a die-bonding material on a lead frame 2 and this optical semiconductor element 1 is wire-bonded by bonding wires 4, 4' to the lead frames 2, 3. A light-reflecting material 5 comprising a cured product formed from the hereinabove-described curable silicone composition is present on the periphery of this optical semiconductor element 1, excluding its upper portion, and the optical semiconductor element 1 within this light-reflecting material 5 is sealed with a sealant 6.

The following method is an example of a method of producing the surface-mount LED shown in FIG. 1: (1) a step of forming the light-reflecting material 5 as a single article with the lead frames 2 and 3, by transfer molding or compression molding the curable silicone composition; (2) a step of die-bonding the optical semiconductor element 1 on the lead frame 2 using a die-bonding material; (3) a step of wire-bonding the optical semiconductor element 1 to the lead frames 2 and 3 with the bonding wires 4 and 4'; and (4) a step of sealing the optical semiconductor element 1 with a sealant 6.

EXAMPLES

The curable silicone composition, cured product thereof, and optical semiconductor device of the present invention will be described in detail through examples. The viscosity is the value at 25° C. In the formulas, Me, Ph, and Vi respectively represent the methyl group, phenyl group, and vinyl group. The hardness of the cured product was measured with the type D durometer specified in JIS K 7215-1986, "Testing methods for durometer hardness of plastics". The bending strength of the cured product was measured by the method specified in JIS K 6911-1995, "Testing methods for thermosetting plastics". The total luminous reflectance of the cured product was measured by the method specified in JIS K 7375:2008, "Plastics—Determination of total luminous transmittance and reflectance". For the linear thermal expansion coefficient of the cured product, the average linear thermal expansion coefficient in the range from 25 to 200° C. was measured by the method specified in JIS K 7197-1991, "Testing method for linear thermal expansion coefficient of plastics by thermomechanical analysis".

Practical Example 1

A curable silicone composition with a viscosity of 39 Pa·s was prepared by mixing the following: 100 parts by mass of a methylvinylphenylpolysiloxane having the average unit formula:

$$(MeViSiO_{2/2})_{0.15}(Me_2SiO_{2/2})_{0.15}(Ph_2SiO_{2/2})_{0.30}(PhSiO_{3/2})_{0.40}(HO_{1/2})_{0.04};$$

25 parts by mass of 1,3,5,7-tetramethyl-1,3,5,7-tetravinylcyclotetrasiloxane having the formula:

$$(MeViSiO)_4;$$

55.6 parts by mass of 1,1,5,5-tetramethyl-3,3-diphenyltrisiloxane having the formula:

$$(HMe_2SiO)_2SiPh_2,$$

in a quantity that provided 0.9 mole of silicon-bonded hydrogen atoms in this component per 1 mole of the total amount of vinyl groups in the methylvinylphenylpolysiloxane and the 1,3,5,7-tetramethyl-1,3,5,7-tetravinylcyclotetrasiloxane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 100 parts by mass of a titanium oxide having an average primary particle size of 0.2 μm (SX-3103 from Sakai Chemical Industry Co., Ltd.); 135 parts by mass of a crushed quartz powder having an average particle size of 5 μm (Crystalite VX-52 from Tatsumori Ltd.); and 110 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 75, a bending strength of 7.0 MPa, a total luminous reflectance of 94.5%, and a linear thermal expansion coefficient of 121 ppm/° C. This cured product was also heated for 1,000 hours at 200° C. After this heating, the cured product had a type D durometer hardness of 78 and a total luminous reflectance of 94.2%.

In order to produce the optical semiconductor device shown in FIG. 1, this composition was molded using a transfer molder at 120° C. as a single article with the lead frames; an excellent molding free of flashing and voids was obtained when this was done.

Practical Example 2

A curable silicone composition with a viscosity of 9.4 Pa·s was prepared by mixing the following: 100 parts by mass of a methylvinylphenylpolysiloxane having the average unit formula:

$$(MeViSiO_{2/2})_{0.25}(Ph_2SiO_{2/2})_{0.3}(PhSiO_{3/2})_{0.45}(HO_{1/2})_{0.04};$$

37.5 parts by mass of phenyltris(dimethylvinylsiloxy)silane having the formula:

$$(ViMe_2SiO)_3SiPh;$$

87 parts by mass of 1,1,5,5-tetramethyl-3,3-diphenyltrisiloxane having the formula:

$$(HMe_2SiO)_2SiPh_2,$$

in a quantity that provided 1.0 mole of silicon-bonded hydrogen atoms in this component per 1 mole of the total amount of vinyl groups in the methylvinylphenylpolysiloxane and the phenyltris(dimethylvinylsiloxy)silane; 10 parts by mass of an SiH-containing methylphenylpolysiloxane having the average unit formula:

$$(Me_2HSiO_{1/2})_{0.6}(PhSiO_{3/2})_{0.4},$$

in a quantity that provided 0.1 mole of silicon-bonded hydrogen atoms in this component per 1 mole of the total amount of vinyl groups in the methylvinylphenylpolysiloxane and the phenyltris(dimethylvinylsiloxy)silane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 80 parts by mass of a titanium oxide having an average primary particle size of 0.24 μm (Tipaque R-630 from Ishihara Sangyo Kaisha, Ltd.); 65 parts by mass of a crushed quartz powder having an average particle size of 5 μm (MIN-U-SIL#5 from Hayashi-Kasei Co., Ltd.); and 135 parts by mass of a spherical silica having an average particle size of 30 μm (FB-570 from Denki Kagaku Kogyo Kabushiki Kaisha).

A cured product was formed by heating this composition for 2 hours at 150° C. This cured product had a type D durometer hardness of 80, a bending strength of 21 MPa, a total luminous reflectance of 94.5%, and a linear thermal expansion coefficient of 94 ppm/° C. This cured product was also heated for 1,000 hours at 200° C. After this heating, the cured product had a type D durometer hardness of 81 and a total luminous reflectance of 94.4%.

In order to produce the optical semiconductor device shown in FIG. 1, this composition was molded using a transfer molder at 120° C. as a single article with the lead frames; an excellent molding free of flashing and voids was obtained when this was done.

Practical Example 3

A curable silicone composition with a viscosity of 130 Pa·s was prepared by mixing the following: 100 parts by mass of a methylvinylphenylpolysiloxane having the average unit formula:

$$(MeViSiO_{2/2})_{0.10}(Me_2SiO_{2/2})_{0.15}(PhSiO_{3/2})_{0.75}(HO_{1/2})_{0.01};$$

37.5 parts by mass of tetrakis(dimethylvinylsiloxy)silane having the formula:

$$(ViMe_2SiO)_4Si;$$

92 parts by mass of 1,1,5,5-tetramethyl-3,3-diphenyltrisiloxane having the formula:

$$(HMe_2SiO)_2SiPh_2,$$

in a quantity that provided 1.1 mole of silicon-bonded hydrogen atoms in this component per 1 mole of the total amount of vinyl groups in the methylvinylphenylpolysiloxane and the tetrakis(dimethylvinylsiloxy)silane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 80 parts by mass of a titanium oxide having an average primary particle size of 0.24 μm (Tipaque R-630 from Ishihara Sangyo Kaisha, Ltd.); 65 parts by mass of a milled glass fiber having an average cut length of 20 μm and an average fiber diameter of 3 μm (MF03JB1-20 from Asahi Fiber Glass Co., Ltd.); and 135 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 82, a bending strength of 16 MPa, a total luminous reflectance of 93.3%, and a linear thermal expansion coefficient of 97 ppm/° C. This cured product was also heated for 1,000 hours at 200° C. After this heating, the cured product had a type D durometer hardness of 85 and a total luminous reflectance of 92.0%.

In order to produce the optical semiconductor device shown in FIG. 1, this composition was molded using a transfer molder at 120° C. as a single article with the lead frames; an excellent molding free of flashing and voids was obtained when this was done.

Practical Example 4

A curable silicone composition with a viscosity of 100 Pa·s was prepared by mixing the following: 100 parts by mass of a methylvinylphenylpolysiloxane having the average unit formula:

$(Me_2ViSiO_{1/2})_{0.20}(PhSiO_{3/2})_{0.80}(HO_{1/2})_{0.02}$;

8 parts by mass of 1,3,5,7-tetramethyl-1,3,5,7-tetravinylcyclotetrasiloxane having the formula:

$(MeViSiO)_4$;

20 parts by mass of a dimethylvinylsiloxy-terminated polymethylphenylsiloxane having the formula:

$ViMe_2SiO(MePhSiO)_{17.5}SiViMe_2$;

35 parts by mass of 1,1,5,5-tetramethyl-3,3-diphenyltrisiloxane having the formula:

$(HMe_2SiO)_2SiPh_2$, in a quantity that provided 0.8 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; 7.5 parts by mass of an SiH-containing methylphenylpolysiloxane having the average unit formula:

$(Me_2HSiO_{1/2})_{0.6}(PhSiO_{3/2})_{0.4}$, in a quantity that provided 0.2 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; a 1,3-divinyl-1,1,3,3-tetramethyldisiloxane solution of platinum/1,3-divinyl-1,1,3,3-tetramethyldisiloxane, in a quantity that provided 5 mass-ppm platinum metal with reference to the present composition; 1-ethynyl-1-cyclohexanol, in a quantity that provided 250 mass-ppm with reference to the present composition; 110 parts by mass of a titanium oxide having an average primary particle size of 0.2 μm (SX-3103 from Sakai Chemical Industry Co., Ltd.); 100 parts by mass of a crushed quartz powder having an average particle size of 5 μm (Silicic SAB-500 from Yamamori Tsuchimoto Mining Co., Ltd.); and 180 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 84, a bending strength of 19 MPa, a total luminous reflectance of 95.3%, and a linear thermal expansion coefficient of 76 ppm/° C. This cured product was also heated for 1,000 hours at 200° C. After this heating, the cured product had a type D durometer hardness of 86 and a total luminous reflectance of 94.6%.

In order to produce the optical semiconductor device shown in FIG. 1, this composition was molded using a transfer molder at 120° C. as a single article with the lead frames; an excellent molding free of flashing and voids was obtained when this was done.

Practical Example 5

A curable silicone composition with a viscosity of 62 Pa·s was prepared by mixing the following: 100 parts by mass of a methylvinylphenylpolysiloxane having the average unit formula:

$(Me_2ViSiO_{1/2})_{0.25}(PhSiO_{3/2})_{0.75}(HO_{1/2})_{0.02}$;

12 parts by mass of 1,3,5,7-tetramethyl-1,3,5,7-tetravinylcyclotetrasiloxane having the formula:

$(MeViSiO)_4$;

15 parts by mass of a dimethylvinylsiloxy-terminated polymethylphenylsiloxane having the formula:

$ViMe_2SiO(MePhSiO)_{17.5}SiViMe_2$;

55 parts by mass of 1,1,5,5-tetramethyl-3,3-diphenyltrisiloxane having the formula:

$(HMe_2SiO)_2SiPh_2$, in a quantity that provided 0.9 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; 4.5 parts by mass of an SiH-containing methylphenylpolysiloxane having the average unit formula:

$(Me_2HSiO_{1/2})_{0.6}(PhSiO_{3/2})_{0.4}$;

in a quantity that provided 0.1 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; a 1,3-divinyl-1,1,3,3-tetramethyldisiloxane solution of platinum/1,3-divinyl-1,1,3,3-tetramethyldisiloxane, in a quantity that provided 5 mass-ppm platinum metal with reference to the present composition; 1-ethynyl-1-cyclohexanol, in a quantity that provided 250 mass-ppm with reference to the present composition; 120 parts by mass of a titanium oxide having an average primary particle size of 0.2 μm (SX-3103 from Sakai Chemical Industry Co., Ltd.); 120 parts by mass of a crushed quartz powder having an average particle size of 5 μm (Silicic SAB-500 from Yamamori Tsuchimoto Mining Co., Ltd.); and 120 parts by mass of a spherical silica having an average particle size of 30 μm (FB-570 from Denki Kagaku Kogyo Kabushiki Kaisha).

A cured product was formed by heating this composition for 2 hours at 150° C. This cured product had a type D durometer hardness of 81, a bending strength of 14 MPa, a total luminous reflectance of 94.2%, and a linear thermal expansion coefficient of 103 ppm/° C. This cured product was also heated for 1,000 hours at 200° C. After this heating, the cured product had a type D durometer hardness of 83 and a total luminous reflectance of 94.2%.

In order to produce the optical semiconductor device shown in FIG. 1, this composition was molded using a transfer molder at 120° C. as a single article with the lead frames; an excellent molding free of flashing and voids was obtained when this was done.

Comparative Example 1

A curable silicone composition with a viscosity of 34 Pa·s was prepared by mixing the following: 100 parts by mass of a methylvinylphenylpolysiloxane having the average unit formula:

$$(MeViSiO_{2/2})_{0.15}(Me_2SiO_{2/2})_{0.15}(Ph_2SiO_{2/2})_{0.30}(PhSiO_{3/2})_{0.40}(HO_{1/2})_{0.04};$$

25 parts by mass of 1,3,5,7-tetramethyl-1,3,5,7-tetravinylcyclotetrasiloxane having the formula:

$$(MeViSiO)_4;$$

48 parts by mass of a trimethylsiloxy-terminated methylhydrogensiloxane/dimethylsiloxane copolymer having the formula:

$$Me_3SiO(MeHSiO)_7(Me_2SiO)_3SiMe_3,$$

in a quantity that provided 0.9 mole of silicon-bonded hydrogen atoms in this component per 1 mole of the total amount of vinyl groups in the methylvinylphenylpolysiloxane and the 1,3,5,7-tetramethyl-1,3,5,7-tetravinylcyclotetrasiloxane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 100 parts by mass of a titanium oxide having an average primary particle size of 0.2 μm (SX-3103 from Sakai Chemical Industry Co., Ltd.); 135 parts by mass of a crushed quartz powder having an average particle size of 5 μm (Crystalite VX-52 from Tatsumori Ltd.); and 110 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 78, a bending strength of 3.1 MPa, a total luminous reflectance of 92.5%, and a linear thermal expansion coefficient of 117 ppm/° C. This cured product was also heated for 1,000 hours at 200° C. After this heating, the cured product had a type D durometer hardness of 88 and a total luminous reflectance of 83.5%.

In order to produce the optical semiconductor device shown in FIG. 1, this composition was molded using a transfer molder at 120° C. as a single article with the lead frames; numerous cracks were produced in the light-reflecting material when this was done.

Comparative Example 2

A curable silicone composition with a viscosity of 260 Pa·s was prepared by mixing the following: 100 parts by mass of a methylvinylphenylpolysiloxane having the average unit formula:

$$(MeViSiO_{2/2})_{0.25}(Ph_2SiO_{2/2})_{0.3}(PhSiO_{3/2})_{0.45}(HO_{1/2})_{0.04};$$

3 parts by mass of phenyltris(dimethylvinylsiloxy)silane having the formula:

$$(ViMe_2SiO)_3SiPh;$$

34.8 parts by mass of 1,1,5,5-tetramethyl-3,3-diphenyltrisiloxane having the formula:

$$(HMe_2SiO)_2SiPh_2,$$

in a quantity that provided 1.0 mole of silicon-bonded hydrogen atoms in this component per 1 mole of the total amount of vinyl groups in the methylvinylphenylpolysiloxane and the phenyltris(dimethylvinylsiloxy)silane; 4 parts by mass of an SiH-containing methylphenylpolysiloxane having the average unit formula:

$$(Me_2HSiO_{1/2})_{0.6}(PhSiO_{3/2})_{0.4};$$

in a quantity that provided 0.1 mole of silicon-bonded hydrogen atoms in this component per 1 mole of the total amount of vinyl groups in the methylvinylphenylpolysiloxane and the phenyltris(dimethylvinylsiloxy)silane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 80 parts by mass of a titanium oxide having an average primary particle size of 0.24 μm (Tipaque R-630 from Ishihara Sangyo Kaisha, Ltd.); 65 parts by mass of a crushed quartz powder having an average particle size of 5 μm (MIN-U-SIL#5 from Hayashi-Kasei Co., Ltd.); and 135 parts by mass of a spherical silica having an average particle size of 30 μm (FB-570 from Denki Kagaku Kogyo Kabushiki Kaisha).

It was quite difficult to obtain a uniform molding due to the overly high viscosity of this composition.

In addition, in order to produce the optical semiconductor device shown in FIG. 1, this composition was molded using a transfer molder at 120° C. as a single article with the lead frames; numerous voids were produced in the interior of the light-reflecting material when this was done.

Comparative Example 3

A curable silicone composition with a viscosity of 12 Pa·s was prepared by mixing the following: 100 parts by mass of a methylvinylphenylpolysiloxane having the average unit formula:

$$(MeViSiO_{2/2})_{0.10}(Me_2SiO_{2/2})_{0.15}(PhSiO_{3/2})_{0.75}(HO_{1/2})_{0.01};$$

55 parts by mass of tetrakis(dimethylvinylsiloxy)silane having the formula:

$$(ViMe_2SiO)_4Si;$$

120 parts by mass of 1,1,5,5-tetramethyl-3,3-diphenyltrisiloxane having the formula:

$$(HMe_2SiO)_2SiPh_2,$$

in a quantity that provided 1.1 moles of silicon-bonded hydrogen atoms in this component per 1 mole of the total amount of vinyl groups in the methylvinylphenylpolysiloxane and the tetrakis(dimethylvinylsiloxy)silane; a 1,3-divinyl-1,1,3,3-tetramethyldisiloxane solution of platinum/1,3-divinyl-1,1,3,3-tetramethyldisiloxane, in a quantity that provided 3.5 mass-ppm platinum metal with reference to the present composition; 1-ethynyl-1-cyclohexanol, in a quantity that provided 200 mass-ppm with reference to the present composition; 80 parts by mass of a titanium oxide having an average primary particle size of 0.24 μm (Tipaque R-630 from Ishihara Sangyo Kaisha, Ltd.); 65 parts by mass of a milled glass fiber having an average cut length of 20 μm and an average fiber diameter of 3 μm (MF03JB1-20 from Asahi Fiber Glass Co., Ltd.); and 135 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 89, a bending strength of 2.2 MPa, a total luminous reflectance of 93.8%, and a linear thermal expansion coefficient of 84 ppm/° C. This cured product was also heated for 1,000 hours at 200° C. Numerous cracks were produced in this cured product by the heating.

In order to produce the optical semiconductor device shown in FIG. 1, this composition was molded using a transfer molder at 120° C. as a single article with the lead frames; numerous cracks were produced in the light-reflecting material when this was done.

Comparative Example 4

A curable silicone composition with a viscosity of 100 Pa·s was prepared by mixing the following: 100 parts by mass of a methylvinylphenylpolysiloxane having the average unit formula:

$(Me_2ViSiO_{1/2})_{0.20}(PhSiO_{3/2})_{0.80}(HO_{1/2})_{0.02};$ 8 parts by mass of 1,3,5,7-tetramethyl-1,3,5,7-tetravinylcyclotetrasiloxane having the formula:

$(MeViSiO)_4;$ 20 parts by mass of a dimethylvinylsiloxy-terminated polymethylphenylsiloxane having the formula:

$ViMe_2SiO(MePhSiO)_{17.5}SiViMe_2;$ 35 parts by mass of 1,1,5,5-tetramethyl-3,3-diphenyltrisiloxane having the formula:

$(HMe_2SiO)_2SiPh_2,$ in a quantity that provided 0.8 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; 7.5 parts by mass of an SiH-containing methylphenylpolysiloxane having the average unit formula:

$(Me_2HSiO_{1/2})_{0.6}(PhSiO_{3/2})_{0.4},$ in a quantity that provided 0.2 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; a 1,3-divinyl-1,1,3,3-tetramethyldisiloxane solution of platinum/1,3-divinyl-1,1,3,3-tetramethyldisiloxane, in a quantity that provided 5 mass-ppm platinum metal with reference to the present composition; 1-ethynyl-1-cyclohexanol, in a quantity that provided 250 mass-ppm with reference to the present composition; 40 parts by mass of a titanium oxide having an average primary particle size of 0.2 μm (SX-3103 from Sakai Chemical Industry Co., Ltd.); 170 parts by mass of a crushed quartz powder having an average particle size of 5 μm (Silicic SAB-500 from Yamamori Tsuchimoto Mining Co., Ltd.); and 250 parts by mass of a spherical silica having an average particle size of 15 μm (HS-202 from Nippon Steel Materials Co., Ltd., Micron Co.).

A cured product was formed by heating this composition for 2 hours at 150° C. This cured product had a type D durometer hardness of 76, a bending strength of 11 MPa, a total luminous reflectance of 78.2%, and a linear thermal expansion coefficient of 76 ppm/° C. This cured product was also heated for 1,000 hours at 200° C. After this heating, the cured product had a type D durometer hardness of 81 and a total luminous reflectance of 43.5%.

In order to produce the optical semiconductor device shown in FIG. 1, this composition was molded using a transfer molder at 120° C. as a single article with the lead frames; while an excellent molding was obtained when this was done, the light-reflecting material did not have a satisfactory whiteness.

Comparative Example 5

A curable silicone composition with a viscosity of 450 Pa·s was prepared by mixing the following: 100 parts by mass of a methylvinylphenylpolysiloxane having the average unit formula:

$(Me_2ViSiO_{1/2})_{0.25}(PhSiO_{3/2})_{0.75}(HO_{1/2})_{0.02};$ 12 parts by mass of 1,3,5,7-tetramethyl-1,3,5,7-tetravinylcyclotetrasiloxane having the formula:

$(MeViSiO)_4;$ 15 parts by mass of a dimethylvinylsiloxy-terminated polymethylphenylsiloxane having the formula:

$ViMe_2SiO(MePhSiO)_{17.5}SiViMe_2;$ 55 parts by mass of 1,1,5,5-tetramethyl-3,3-diphenyltrisiloxane having the formula:

$(HMe_2SiO)_2SiPh_2,$ in a quantity that provided 0.9 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; 4.5 parts by mass of an SiH-containing methylphenylpolysiloxane having the average unit formula:

$(Me_2HSiO_{1/2})_{0.6}(PhSiO_{3/2})_{0.4},$ in a quantity that provided 0.1 mole of silicon-bonded hydrogen atoms in this component per 1 mole of the total amount of vinyl groups in the methylvinylphenylpolysiloxane, the 1,3,5,7-tetramethyl-1,3,5,7-tetravinylcyclotetrasiloxane, and the dimethylvinylsiloxy-terminated polymethylphenylsiloxane; a 1,3-divinyl-1,1,3,3-tetramethyldisiloxane solution of platinum/1,3-divinyl-1,1,3,3-tetramethyldisiloxane, in a quantity that provided 5 mass-ppm platinum metal with reference to the present composition; 1-ethynyl-1-cyclohexanol, in a quantity that provided 250 mass-ppm with reference to the present composition; 120 parts by mass of a titanium oxide having an average primary particle size of 0.2 μm (SX-3103 from Sakai Chemical Industry Co., Ltd.); 240 parts by mass of a crushed quartz powder having an average particle size of 5 μm (Silicic SAB-500 from Yamamori Tsuchimoto Mining Co., Ltd.); and 240 parts by mass of a spherical silica having an average particle size of 15 μm (HS-202 from Nippon Steel Materials Co., Ltd., Micron Co.).

It was quite difficult to obtain a uniform molding due to the overly high viscosity of this composition.

In addition, in order to produce the optical semiconductor device shown in FIG. 1, this composition was molded using a transfer molder at 120° C. as a single article with the lead frames; numerous voids were produced in the interior of the light-reflecting material when this was done.

INDUSTRIAL APPLICABILITY

The curable silicone composition of the present invention has an excellent moldability and upon curing is resistant to the appearance of a heat- and/or light-induced decline in mechanical strength and the appearance of heat- and/or light-induced discoloration, and for these reasons is well adapted for application as a material for molding a white frame for a light-emitting diode.

DESCRIPTION OF SYMBOLS 1 optical semiconductor element
2 lead frame
3 lead frame
4, 4' bonding wire
5 light-reflecting material comprising a silicone cured product
6 sealant

The invention claimed is:

1. A curable silicone composition comprising:
(A) 100 parts by mass of an organopolysiloxane represented by the following average unit formula:

$(R^1_3SiO_{1/2})_a(R^1_2SiO_{2/2})_b(R^1SiO_{3/2})_c(SiO_{4/2})_d$
$(R^2O_{1/2})_e$ wherein each $R^1$ is independently a phenyl group, a $C_{1-6}$ alkyl group, or a $C_{2-6}$ alkenyl group; however, from 30 to 80 mole % of all groups designated by $R^1$ are phenyl groups and from 5 to 20 mole % of all groups designated by $R^1$ are alkenyl groups; $R^2$ is a hydrogen atom or a $C_{1-6}$ alkyl group; and "a", "b", "c", "d", and "e" are numbers that respectively satisfy: $0 \le a \le 0.3$, $0 \le b \le 0.7$, $0.3 \le c \le 0.9$, $0 \le d \le 0.1$, $0 \le e \le 0.1$, and $a+b+c+d=1$;

(B) 5 to 50 parts by mass of an organopolysiloxane that has not more than 10 silicon atoms wherein from 30 to 60 mole % of all silicon-bonded organic groups are $C_{2-6}$ alkenyl groups;

(C) 0 to 40 parts by mass of an organopolysiloxane represented by the following general formula:

$R^3_3SiO(R^3_2SiO)_mSiR^3_3$ wherein each $R^3$ independently represents a phenyl group, a $C_{1-6}$ alkyl group, or a $C_{2-6}$ alkenyl group; however, from 30 to 70 mole % of all groups designated by $R^3$ are phenyl groups and at least one of all groups designated by $R^3$ is an alkenyl group; and "m" is an integer from 10 to 100;

(D) an organopolysiloxane that has at least two silicon-bonded hydrogen atoms in one molecule wherein from 20 to 70 mole % of all silicon-bonded organic groups are phenyl groups, in an amount that provides from 0.5 to 2 moles of silicon-bonded hydrogen atoms in this component per 1 mole of the total amount of the alkenyl groups in components (A), (B), and (C);

(E) a hydrosilylation reaction catalyst in a quantity sufficient to accelerate the hydrosilylation reaction between the alkenyl groups in components (A), (B), and (C) and the silicon-bonded hydrogen atoms in component (D);

(F) a white pigment in an amount of at least 25 parts by mass per 100 parts by mass of the total amount of components (A), (B), (C), (D), and (E);

(G) a nonspherical silica or a glass fiber in an amount of at least 20 parts by mass per 100 parts by mass of the total amount of components (A), (B), (C), (D), and (E); and (H) a spherical silica in an amount of at least 20 parts by mass per 100 parts by mass of the total amount of components (A), (B), (C), (D), and (E), wherein the content of the total amount of components (F), (G), and (H) is not more than 300 parts by mass per 100 parts by mass of the total amount of components (A), (B), (C), (D), and (E).

2. The curable silicone composition according to claim 1, that has a viscosity at 25° C. of from 5 to 200 Pa·s.

3. The curable silicone composition according to claim 1, that cures to form a cured product that has a durometer D hardness of at least 60 and that has a bending strength of at least 5 MPa.

4. The curable silicone composition according to claim 1, that cures to form a cured product that has a total luminous reflectance of at least 80%.

5. The curable silicone composition according to claim 1, that cures to form a cured product that has an average linear thermal expansion coefficient in the range from 25 to 200° C. of not more than 200 ppm/° C.

6. A cured product provided by the cure of the curable silicone composition according to claim 1.

7. An optical semiconductor device that is provided with a light-reflecting material formed of a cured product from the curable silicone composition according to claim 1.

8. The curable silicone composition according to claim 1, wherein from 40 to 70 mole % of all groups designated by $R^1$ are phenyl groups, and $0 \le a \le 0.25$, $0 \le b \le 0.6$, and $0.35 \le c \le 0.85$.

9. The curable silicone composition according to claim 1, wherein component (B) is selected from 1,3,5,7-tetramethyl-1,3,5,7-tetravinylcyclotetrasiloxane, tetrakis(dimethylvinylsiloxy)silane, methyltris(dimethylvinylsiloxy)silane, and phenyltris(dimethylvinylsiloxy)silane.

10. The curable silicone composition according to claim 1, wherein component (D) is selected from;
(a) an organotrisiloxane having the following general formula:

$(HR^4_2SiO)_2SiR^4_2$ wherein each $R^4$ in the formula is independently a phenyl group or a $C_{1-6}$ alkyl group, and phenyl group content in all groups designated by $R^4$ is in the range from 30 to 70 mole %;

(b) a straight-chain organopolysiloxane having the following general formula:

$R^5_3SiO(R^5_2SiO)_nSiR^5_3$; and (c) a branched-chain organopolysiloxane having the following average unit formula:

$(R^5SiO_{3/2})_p(R^5_2SiO_{2/2})_q(R^5_3SiO_{1/2})_r(SiO_{4/2})_s(XO_{1/2})_t$, wherein each $R^5$ in the formulas above is independently a hydrogen atom, a phenyl group, or a $C_{1-6}$ alkyl group, and at least two of all groups designated by $R^5$ in the formulas are hydrogen atoms, and phenyl group content in all groups designated by $R^5$, excluding the hydrogen atoms, is in the range from 30 to 70 mole %, and wherein "n" in the formulas is an integer in the range from 5 to 1,000, "p" in the formula is a positive number; "q" is 0 or a positive number; "r" is 0 or a positive number; "s" is 0 or a positive number; "t" is 0 or a positive number; "q/p" is a number in the range from 0 to 10; "r/p" is a number in the range from 0 to 5; "s/(p+q+r+s)" is a number in the range from 0 to 0.3; and "t/(p+q+r+s)" is a number in the range from 0 to 0.4.

11. The curable silicone composition according to claim 1, wherein at least 50 mass % of component (D) is an organotrisiloxane having the following general formula:

$$(HR^4{}_2SiO)_2SiR^4{}_2$$

wherein each $R^4$ in the formula is independently a phenyl group or a $C_{1-6}$ alkyl group.

12. The curable silicone composition according to claim 11, wherein phenyl group content in all groups designated by $R^4$ is in the range from 30 to 70 mole %.

* * * * *